(12) United States Patent
Fukumasa

(10) Patent No.: US 6,983,412 B2
(45) Date of Patent: Jan. 3, 2006

(54) CONCATENATION CONVOLUTIONAL CODE DECODER

(75) Inventor: Hidenobu Fukumasa, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 480 days.

(21) Appl. No.: 10/149,021

(22) PCT Filed: Dec. 7, 2000

(86) PCT No.: PCT/JP00/08677

§ 371 (c)(1),
(2), (4) Date: Jun. 6, 2002

(87) PCT Pub. No.: WO01/43292

PCT Pub. Date: Jun. 14, 2001

(65) Prior Publication Data

US 2003/0005388 A1 Jan. 2, 2003

(30) Foreign Application Priority Data

Dec. 7, 1999 (JP) .......................................... 11-348073

(51) Int. Cl.
*H03M 13/00* (2006.01)

(52) U.S. Cl. ........................ 714/755; 714/786; 714/758
(58) Field of Classification Search ................. 714/755, 714/793, 786, 758, 795; 375/341, 316
See application file for complete search history.

(56) References Cited

U.S. PATENT DOCUMENTS

| | | | | |
|---|---|---|---|---|
| 5,414,738 A | * | 5/1995 | Bienz ........................... | 375/341 |
| 6,000,054 A | * | 12/1999 | Bahr et al. ................... | 714/786 |
| 6,075,824 A | * | 6/2000 | Trost et al. .................. | 375/316 |
| 6,202,189 B1 | * | 3/2001 | Hinedi et al. ................ | 714/786 |
| 6,347,391 B1 | * | 2/2002 | Uesugi et al. ............... | 714/795 |
| 6,671,852 B1 | * | 12/2003 | Ariel et al. .................. | 714/793 |
| 6,775,800 B2 | * | 8/2004 | Edmonston et al. ........ | 714/755 |

FOREIGN PATENT DOCUMENTS

| | | |
|---|---|---|
| JP | 10-117180 A | 5/1998 |
| JP | 10-126383 A | 5/1998 |
| JP | 10-190495 A | 7/1998 |
| JP | 10-247894 A | 9/1998 |
| JP | 11-168408 A | 6/1999 |
| JP | 11-186991 A | 7/1999 |
| JP | 11-266226 A | 9/1999 |
| JP | 2000-269934 A | 9/2000 |
| WO | 96/42146 A1 | 12/1996 |

OTHER PUBLICATIONS

Berrou et al, "Near Optimum Error Correcting Coding and Decoding: Turbo–Codes", Transactions Papers, IEEE Transactions and Communications, vol. 44, No. 10, Oct. 1996, pp. 1261–1271.

Hagenauer et al, "Iterative Decoding of Binary Block and Convolutional Codes", IEEE Transactions on Information Theory, vol. 41, No. 2, Mar. 1996, pp. 429–445.

(Continued)

*Primary Examiner*—Guy LaMarre
*Assistant Examiner*—Mujtaba Chaudry
(74) *Attorney, Agent, or Firm*—Nixon & Vanderhye, P.C.

(57) ABSTRACT

Since iterative decoding of turbo codes or SCCC outputs provisional decoded result and likelihood information in the course of the decoding process, effective use of this makes it possible to implement interference cancellation without marked increase in the amount of operations for decoding. For this purpose, decoding of a plurality of turbo code signals or SCCC blocks interfering with one another is implemented in parallel so that iterative decoding is performed making use of the decoded data and likelihood information obtained as the transitive decoding result of turbo codes or SCCC, to decode other blocks.

14 Claims, 12 Drawing Sheets

OTHER PUBLICATIONS

Benedetto et al, "Serial Concatenation of Interleaved Codes: Performance Analysis, Design, and Iterative Decoding", IEEE Transactions on Information Theory, vol. 44, No. 3, May 1998, pp. 909–926.

Yoon et al, "A Spread–Spectrum Multiaccess System with Cochannel Interference Cancellation for Multipath Fading Channels", IEEE Journal on Selected Areas in Communcations, vol. 11, No. 7, Sep. 1993, pp. 1067–1075.

Alexander et al, "Iterative Multiuser Interference Reduction: Turbo CDMA", IEEE Transactions on Communications, vol. 47, No. 7, Jul. 1999, pp. 1008–1014.

Wang et al, "Iterative (Turbo) Soft Interference Cancellation and Decoding for Coded CDMA", IEEE Transactions on Communications, vol. 47, No. 7, Jul. 1999, pp. 1046–1061.

Notification of Reasons(s) for Refusal and translation thereof mailed Jul. 1, 2003 in corresponding Japanese Application No. 11-348073.

Isaka et al, A Tutorial on "Parallel Concatenated (Turbo) Coding", "Turbo (iterative) decoding" and Related Topics, The Institute of Electronics, Technical Report of IEICE, IT98–51, 1998–12, pp. 1–18.

* cited by examiner

FIG. 10
(PRIOR ART)
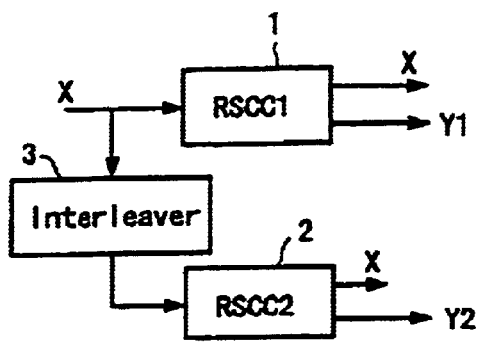
X: Information
Y1, Y2 : Parity
(a) Turbo Encoder
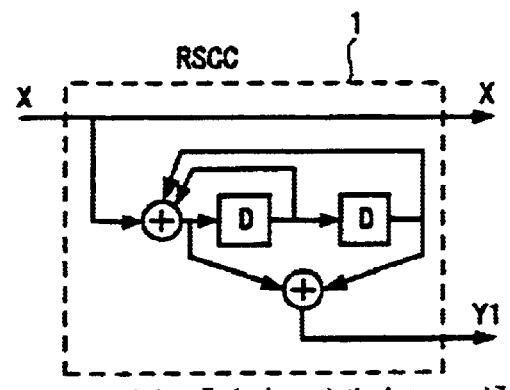
$G(D) = [1(D^2-1)/(D^2+D+1)]$
(b) RSCC Encoder
FIG. 11
(PRIOR ART)
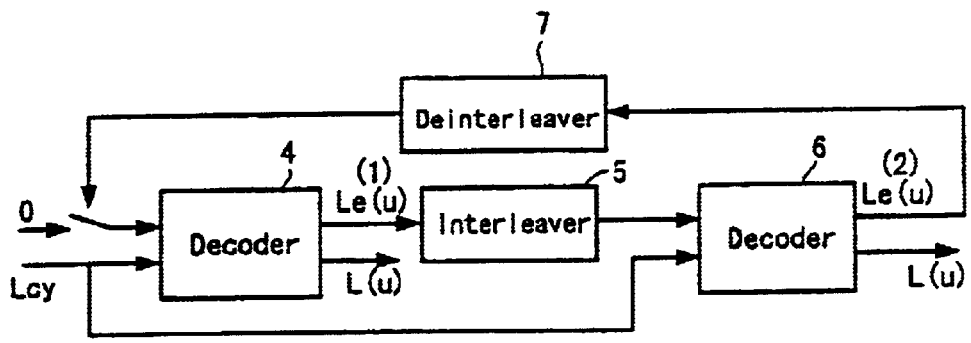
Block Diagram of Turbo-code Decoder

CONCATENATION CONVOLUTIONAL CODE DECODER

This application is the US national phase of international application PCT/JP00/08677 filed 7 Dec. 2000, which designated the US.

TECHNICAL FIELD

The present invention relates to digital communications using an error correction technique.

BACKGROUND ART

Recently, rapid development has been found in the industries field relating to digital communications such as the Internet, digital cellular phones. Under such circumstances, basic studies for high-speed high-quality communications of information of importance have been intensively made. Of these studies, error correction techniques are part and parcel of establishment of high-quality communications using unstable communications paths such as digital mobile communications.

Turbo-coding is remarkable error correction codes that enable high-quality data communications to be made with a lesser amount of energy and have drawn wide attraction in recent years. In the field of digital mobile communications, this technique is highly expected to be adopted as a next-generation standard.

On the other hand, in the field of the CDMA (Code Division Multiple Access) technique, which is also expected to be a next-generation standard, the technique of interference cancellation for reducing interference has markedly drawn attraction because the capacity of the system is limited depending on the amount of interference.

Turbo coding is a new coding scheme published in 1993, and is constructed of a combination of two (or more than two) kinds of systematic convolutional coding (C. Berrou et al. "Near Shannon Limit error-correcting coding: Turbo codes", Proceedings of ICF93 or "Near Optimum error-correcting coding: Turbo codes", IEEE Transactions on Communications, Vol.44, no.10, 1996). The decoding process of turbo codes is featured by reducing errors by successively repeating decoding operations of these two kinds of systematic convolutional codes. Here, the configuration of the Turbo encoder and decoder and its decoding method will be described briefly. For detailed information, reference should be made to Isaka et al., 'Fingerpost to Shannon limit: "parallel concatenated (Turbo) coding", "Turbo (iterative) decoding" and its surroundings', Technical Report IT98-51 of The Institute of Electronics, Information and Communication Engineers, J. Hagenauer "Iterative Decoding of Binary Block and Convolutional Codes", IEEE Transactions on Information Theory, Vol.42, No.2 1996, and the like.

An encoder for turbo codes is shown in FIG. 10 and a block diagram of its decoder is shown in FIG. 11. Two recursive systematic convolutional code (RSCC) encoders 1 and 2 are provided in parallel with an interleaver 3 interposed therebetween. An original information bit sequence X is rearranged into an interleaved stream, which is input to the second encoder 2. Now, provided that the coding rate of the recursive systematic convolutional encoder is 1/2, parity bits Y1 and Y2, which are obtained from respective encoders 1 and 2, are added to the original information bit X, to produce a turbo code with a coding rate of 1/3.

With the decoder shown in FIG. 11, a decoder 4 first performs decoding of the first systematic convolutional codes, then the decoded result, after being processed through an interleaver 5, is supplied to a decoder 6, where decoding of the second systematic convolutional codes is performed. This result is further processed through deinterleaver 7 to be supplied to decoder 4 where decoding of the first systematic convolutional codes is performed again. This iterative decoding gradually improves the reliability of decoded symbols and reduces errors.

In decoding of systematic convolutional codes implemented in the process of the turbo coding, it is necessary to have the decoded result in addition with soft-decision information in order for it to be used for the subsequent decoding step. Decoder 4, which corresponds to RSCC1, receives the signal (Lc y) that is obtained by having the received symbols weighted in proportion to the SNR (signal to noise ratio) and extrinsic information (likelihood information) and outputs the decoded result L(u) with the logarithm of likelihood ratio and extrinsic information $L_e(U)$ which is passed over to the subsequent decoder.

There are several decoding methods which can provide soft-decision result. Here, the MAP will be described.

MAP (Maximum A Posteriori Probability) decoding is one that determines, for each information symbol uk, the uk which will maximize the P(uk) under a condition where a received signal sequence y is given, as the decoded result. For this purpose, LLR (logarithm likelihood ratio: L(uk)) is determined in the following equation (1)

$$L(u_k) = \log\frac{P(u_k=+1\,|\,y)}{P(u_k=-1\,|\,y)} = \log\frac{\sum_{(s_{k-1},s_k),u_k=+1} p(s_{k-1}, s_k, y)}{\sum_{(s_{k-1},s_k),u_k=-1} p(s_{k-1}, s_k, y)} \quad \text{(Eq. 1)}$$

where $$p(s_{k-1}, s_k, y) = p(s_{k-1}, y_{j<k}) \cdot p(s_k, y_k\,|\,s_{k-1}) \cdot p(y_{j>k}\,|\,s_k)$$

$$= p(s_{k-1}, y_{j<k}) \cdot p(s_k\,|\,s_{k-1}) \cdot p(s_k, y_k\,|\,s_{k-1}, s_k) \cdot p(y_{j>k}\,|\,s_k)$$

$$= \alpha_{k-1}(s_{k-1}) \cdot \gamma_k(s_{k-1}, s_k) \cdot \beta_k(s_k).$$

$\alpha_{k-1}(s_{k-1}) = P(s_{k-1}, y_j<_k)$ is the possibility of the state being $s_{k-1}$ at time k−1, determined recursively from the initial state. $\beta_k(s_k) = P(y_{j>k}|s_k)$ is the possibility of the state being $s_k$ at time k, similarly determined from the final state. $\gamma_k(s_{k-1}, s_k)$ is the possibility of the transition from the state $s_{k-1}$ at time k−1 to the state $s_k$ at time k, and is given as the following equation (2):

$$\gamma_k(s_{k-1}, s_k) = P(s_k|s_{k-1}) \cdot p(y_k|s_k) \quad \text{(Eq.2)}$$

The above Eq. (2) can be calculated by Eq. (3 as follows:

$$\gamma_k(s_{k-1}, s_k) = \exp\left[\frac{1}{2}u_k(L^e(u_k) + L_c y_k^s) + \frac{1}{2}L_c y_k^p x_k^p\right] \quad \text{(Eq. 3)}$$

$\alpha_k(s_k)$ and $\beta_k(s_k)$ are obtained recursively by the following equations (4) and (5).

$$\alpha_k(s_k) = \sum_{s_{k-1}} \gamma_k(s_{k-1}, s_k) \cdot \alpha_{k-1}(s_{k-1}) \quad \text{(Eq. 4)}$$

$$\beta_{k-1}(s_{k-1}) = \sum_{s_k} \gamma_k(s_{k-1}, s_k) \cdot \beta_k(s_k) \quad \text{(Eq. 5)}$$

With these, the logarithm of likelihood ratio $L(u_k)$ is determined by the following equation (6)

$$L(u_k) = \log\left(\frac{\sum_{S+} \alpha_{k-1}(s_{k-1}) \cdot \gamma_k(s_{k-1}, s_k) \cdot \beta_k(s_k)}{\sum_{S-} \alpha_{k-1}(s_{k-1}) \cdot \gamma_k(s_{k-1}, s_k) \cdot \beta_k(s_k)}\right) \quad \text{(Eq. 6)}$$

where $$\sum_{S+}$$

indicates the summation when $u_k=1$ and $$\sum_{S-}$$

indicates the summation when $u_k=-1$.

Further, the extrinsic likelihood information $L^e(u_k)$ to be sent to the subsequent systematic convolutional code encoder is obtained by subtracting the weighted, received signal $L_c y_k^s$ and the extrinsic likelihood information $L^c(u_k)$ that was input to this decoder, from the above logarithm of likelihood ratio $L(u_k)$.

Here, in the above-described turbo encoder, two systematic convolutional encoders 1 and 2 are used in parallel with an interleaver 3 in between, but two systematic convolutional encoders 1 and 2 may be used serially as shown in FIG. 12 to construct a serial concatenation of interleaved codes (SCCC), which also function as similar error correcting codes. In the configuration shown in FIG. 12, a puncture P is interposed between the parallel/serial converter P/S on the downstream side of systematic convolutional encoder 1 and interleaver 3 so as to thin out part of the bit sequence, to thereby improve the coding efficiency of the outer code encoder.

Also in the decoding process of serially concatenated convolutional codes, soft-input soft-output decoders are used to successively decode two kinds of systematic convolutional codes in a similar manner to the way the turbo codes are decoded as shown in FIG. 13, so as to able to reduce errors by performing iterative decoding using the likelihood information of the previously decoded result. Here, the systematic convolutional encoder 1 as the outer-code encoder (FIG. 12) and the systematic convolutional encoder 2 as the inner-code encoder may be configured of other systematic convolutional encoders. For the detail of the SCCC, reference should be made to Sergio Benedetto et al. "Serial Concatenation of Interleaved Codes: Performance Analysis, Design, and Iterative Decoding", IEEE Transactions on Information Theory, Vol.44, No.5 May 1998.

Next, interference cancelers for removing interference with other stations in the CDMA system will be described. Many study reports have been presented on the interference cancelers for removing interference with other stations in the CDMA system. For example, Y. C. Yoon et al. "A Spread-Spectrum Multiaccess System with Cochannel Interference Cancellation for Multipath Fading Channels", IEEE Journal on Selected Areas in Communications, vol.11, No.7, September 1993.

When k users share the same frequency by code division multiple access, the received signal is formulated by the following equation (7).

$$r(t) = n(t) + \sum_{k=1}^{K} s_k(t - \tau_k) \quad \text{(Eq. 7)}$$

In this case, for a user who tries to receive $s_1(t)$, the other signals $s_k(t)(k \neq 1)$ are interference signals which degrade the communication quality. To deal with this, as shown in the following equation (8), the receiver of $s_1(t)$ demodulates signals $s_k(t)(k \neq 1)$ at the same time to produce replica signals $rs_k(t)$ and subtracts them from the received signal to thereby remove the interference components from the signal.

$$r(t) - \sum_{k=2}^{K} rs_k(t - \tau_k) = s_1(t - \tau_1) + n(t) + E(t) \quad \text{(Eq. 8)}$$

Here, since the replica signals are not always correct, some error (the term e(t)) may arise if this is so. This error will be generated by decision errors of the demodulated data and/or estimation errors of $\tau_k$. Since use of the data judged from the signal having undergone interference cancellation improves the accuracy of the replicas, it can be expected that multiple numbers of canceling will be able to reduce the error ratio of the wanted signal step by step. This scheme is called subtract type multi-stage canceller.

In the conventional schemes, the decoding process of error correcting codes and the interference cancellation are performed separately. Therefore, if interference cancellation is imperfect, this is regarded as noise which is impossible to be removed, causing deterioration of error correcting capability.

Further, since complex decoding is needed when error correcting codes such as convolutional codes are used, it is considered that it is difficult to combine multi-stage interference cancellation with the decoding process.

The present invention has been devised in order to solve the above problems, it is therefore an object of the present invention to provide a parallel or serial concatenated convolutional code decoder which is able to perform decoding of error correcting codes and interference cancellation simultaneously with a simple configuration.

DISCLOSURE OF INVENTION

In order to achieve the above object, the present invention has the following configurations.

The first aspect of the present invention resides in a concatenated convolutional code decoder in a receiving device which receives transmitted signals of encoded signals, which each have been produced by convolutionally encoding an information signal using a concatenated convolutional encoder having a first convolutional encoder and second convolutional encoder for implementing conventional encoding, connected in parallel or in series with an interleaver interposed therebetween for rearranging input data based on a predetermined rule, the concatenated convolutional code decoder comprising: a plurality of decoding and encoding portions, each having (i) a soft-decision decoding portion for implementing a soft-decision decoding process which decodes a received signal using a likelihood information for decoding produced by a previous soft-decision decoding process and outputs a decoded signal and a likelihood information for decoding of the decoded signal, (ii) a concatenated convolutional encoding portion for subjecting the decoded signal at the soft-decision decoding portion to the same convolutional encoding process as that of a concatenated convolutional encoder to produce a replica of a transmitted encoded signal, and (iii) a transmitted signal replicating portion for producing a replica of a transmitted signal from the replica of the encoded signal produced at the concatenated convolutional encoding portion; and an interference canceler for removing from the received signal an interference signal which is determined by the transmitted signal replicating portion, based on a replica of a transmitted signal from a transmitting station from which no reception is wanted, wherein a received signal output from the interference canceler is subjected to the soft-decision decoding process at the soft-decision decoding portion to extract an information signal.

The second aspect of the present invention, resides in a concatenated convolutional code decoder in a receiving device which receives transmitted signals of encoded signals with parity signals, which each have been produced by convolutionally encoding an information signal using a concatenated convolutional encoder having a first convolutional encoder and second convolutional encoder for implementing conventional encoding, connected in parallel or in series with an interleaver interposed therebetween for rearranging input data based on a predetermined rule, the concatenated convolutional code decoder comprising: a plurality of decoding and encoding portions, each having (i) a soft-decision decoding portion for implementing a soft-decision decoding process which decodes a received signal using a likelihood information for decoding produced by a previous soft-decision decoding process and outputs a decoded signal, a likelihood information for decoding of the decoded signal and a code sequence likelihood information of the decoded signal and parity signals, (ii) a concatenated convolutional encoding portion for subjecting the information signal determined at the soft-decision decoding portion to the same convolutional encoding process as that of the concatenated convolutional encoder to produce a replica of a transmitted encoded signal, (iii) a transmitted signal replicating portion for producing a replica of a transmitted signal from the replica of the transmitted encoded signal produced at the concatenated convolutional encoding portion, and (iv) a weighting portion for weighting the replica of the encoded signal or the replica of the transmitted signal using the code sequence likelihood information; and an interference canceler for removing from the received signal an interference signal which is determined by the weighting portion, based on a replica of a transmitted signal from a transmitting station from which no reception is wanted, wherein a received signal output from the interference canceler is subjected to the soft-decision decoding process at the soft-decision decoding portion to extract an information signal.

The third aspect of the present invention resides in the concatenated convolutional code decoder, defined by the first or second aspect, wherein the processing sequence from the interference canceler to the decoding and encoding portion can be repeated by a predetermined number of times.

The fourth aspect of the present invention resides in the concatenated convolutional code decoder, defined by any one of the first through third aspects, the soft-decision decoding portion determines the information signal after the soft-decision decoding process has been repeated by a predetermined number of times.

The fifth aspect of the present invention resides in the concatenated convolutional code decoder, defined by the first aspect, wherein the received signal is a spread signal including transmitted signals from a plurality of transmitting stations, a despreading portion for despreading the received signal using a spreading code of each of the transmitting stations are provided, the soft-decision decoding portion receives as an input signal a signal that has been despread by the despreading portion, and the transmitted signal replicating portion has a spreading portion for spreading the replica of the transmitted signal.

The sixth aspect of the present invention resides in the concatenated convolutional code decoder, defined by the second aspect, wherein the received signal is a spread signal including transmitted signals from a plurality of transmitting stations, a dispreading portion for despreading the received signal using a spreading code of each of the transmitting stations are provided, the soft-decision decoding portion receives as an input a signal that has been despread by the despreading portion, and the transmitted signal replicating portion has a spreading portion for spreading the replica of the transmitted signal weighted by the weighting portion.

The seventh aspect of the present invention resides in the concatenated convolutional code decoder, defined by the first or second aspect, wherein the received signal is a despread signal based on a spreading code, the interference canceler is adapted to weight the interference signal of the replica, being among the replicas of the transmitted signals produced at the transmitted signal replicating portions, of the transmitted signal which is not wanted to be received, in accordance with a cross-correlation between the spread codes and implements an interference cancellation in units of the symbols after despreading.

The eighth aspect of the present invention resides in the concatenated convolutional code decoder, defined by the first aspect, wherein the soft-decision decoding portion comprises: a first soft-decision decoder for implementing soft-decision decoding corresponding to a first convolutional encoder based on the received signal and outputting a first likelihood information; an interleaver portion for rearranging the received signal and the first likelihood information in correspondence with the interleaver and outputting a rearranged received signal and a rearranged first likelihood information; a second soft-decision decoder for implementing soft-decision decoding corresponding to a second convolutional encoder based on the received signal, the rearranged first likelihood information and the rearranged received signal and outputting a second decoding information and a second likelihood information; a deinterleaver portion for rearranging the second decoding information and the second likelihood information in correspondence with the interleaver and outputting a rearranged second decoding information and the likelihood information for decoding; and a decoding judgment portion for judging the rearranged second decoding information and outputting the decoded information signal.

The ninth aspect of the present invention resides in the concatenated convolutional code decoder, defined by the second aspect, wherein the soft-decision decoding portion comprises: a first soft-decision decoder for implementing soft-decision decoding corresponding to a first convolutional encoder based on the received signal and outputting a first likelihood information and a first parity likelihood information as to a first parity signal; an interleaver portion for rearranging the received signal and the first likelihood information in correspondence with the interleaver and outputting a rearranged received signal and a rearranged first likelihood information; a second soft-decision decoder for implementing soft-decision decoding corresponding to a second convolutional encoder based on the received signal, the rearranged first likelihood information and the rearranged received signal and outputting a second decoding information, a second likelihood information and a second parity likelihood information as to a second parity signal; a deinterleaver portion for rearranging the second decoding information and the second likelihood information in correspondence with the interleaver and outputting a rearranged second decoding information and the likelihood information for decoding; a decoding judgment portion for judging the rearranged second decoding information and outputting the decoded information signal; and a likelihood information synthesizer for outputting a code sequence likelihood information based on the rearranged second decoding information, the first parity likelihood information and the second parity likelihood information.

According to the first aspect of the present invention, the receiver receives a plurality of transmitted signals of code signals, each being made up of a convolutionally encoded information signal and having been transmitted from a plurality of transmitting stations. In each of the plurality series of decoding and encoding portions provided for each of the received signals from different transmitting stations, the information signal and the replica of the transmitted signal for each of the received signals from different transmitting stations is produced, so as to obtain the desired information signal again by canceling the received signal from the transmitting station from which no reception is wanted.

To produce the replica of the transmitted signal, first, the soft-decision decoding portion implements the soft-decision decoding process made up of decoding the received signal using the likelihood information produced by the previous soft-decision decoding process and outputting the decoded signal and the likelihood information of the decoded signal.

Next, the concatenated convolutional encoding portion subjects the decoded signal to the same convolutional encoding process as the concatenated convolutional encoder to produce replicas of the transmitted encoded signals.

Further, the transmitted signal replicating portion produces the replica of the transmitted signal from each transmitting station, from each replicas of the encoded signal produced at the concatenated convolutional encoding portion.

Finally, the interference canceler removes from the received signal the interference signal which is determined based on the replica of the transmitted signal from the transmitting station from which no reception is wanted. Then, the received signal from which the interference signal has been canceled is subjected to the soft-decision decoding process at the soft-decision decoding portion, thus making it possible to extract the information signal.

According to the second aspect of the present invention, in addition to the first aspect, the soft-decision decoding portion is adapted to output the likelihood information of the parity signal and the weighting portion is provided to weight the replicas of the coded signals or the replicas of the transmitted signals based on the likelihood information of the parity signals to thereby produce a high-precision decoded result.

According to the third aspect of the present invention, since the processing sequence from the interference canceler to the decoding and encoding portion is allowed to be repeated by a predetermined number of times, it is possible to obtain a high-precision decoded result by increasing the number of repetitions.

According to the fourth aspect of the present invention, since the processing sequence from the interference canceler to the decoding and encoding portion is allowed to be repeated by a predetermined number of times so as to increase the accuracy of the replicas of the transmitted signals, an improved efficiency of the interference cancellation through the interference canceler can be achieved, thus making it possible to obtain a high-precision decoded result.

According to the fifth or sixth aspect of the present invention, the received signal is a spread signal including transmitted signals from a plurality of transmitting stations, despreaders for despreading the received signal using the spreading code of each of the transmitting stations are provided, the soft-decision decoding portion receives as the input signal the signal that has been despread by the despreadlng portions, and the transmitted signal replicating portion has a spreading portion for spreading the replica of the transmitted signal. This configuration improves resistance against interference, anti-multipath characteristics and the like.

According to the seventh aspect of the present invention, the received signal is a despread signal based on the spreading code, the interference canceller weights the interference signal of the replica, being among the replicas of the transmitted signals produced at the transmitted signal replicating portions, of the transmitted signals which are not wanted to be received, in accordance with the cross-correlation between the spread codes and implements interference cancellation in units of the symbols after despreading. This configuration improves the efficiency of interference cancellation through the interference canceler, making it possible to obtain a high-precision decoded result.

According to the eighth and ninth aspects of the present invention, it is possible to output the decoded information signal, the likelihood information and the likelihood information as to the parity signals.

According to the present invention, by adding the operation of canceling the interference components in the decoding process of turbo codes, it is possible to bring great improvement in the characteristics such that decoding process of error correcting codes and interference cancellation process can be performed simultaneously while increase in the amount of processing is suppressed.

BRIEF DESCRIPTION OF DRAWINGS

FIG. 10 is a block diagram showing a conventional turbo encoder;

FIG. 11 is a block diagram showing a conventional turbo-code decoder;

BEST MODE FOR CARRYING OUT THE INVENTION

The embodiments of the present invention have been devised by paying attention to the fact that iterative decoding of parallel or serial concatenated convolutional codes, such as turbo codes, SCCC and the like, outputs provisional decoded results and likelihood information in the course of the decoding process and effective use of these makes it possible to implement interference cancellation without marked increase in the amount of operations for decoding.

That is, both interference cancellation and iterative decoding of turbo codes, SCCC or the like are enabled to be performed simultaneously by decoding a plurality of turbo codes, SCCC or the like which interfere with one another, in parallel and block-wise, performing iterative decoding, making use of the decoded data and likelihood information obtained as the transitive decoding result of turbo codes, SCCC or the like, to decode other blocks.

Figure 1:
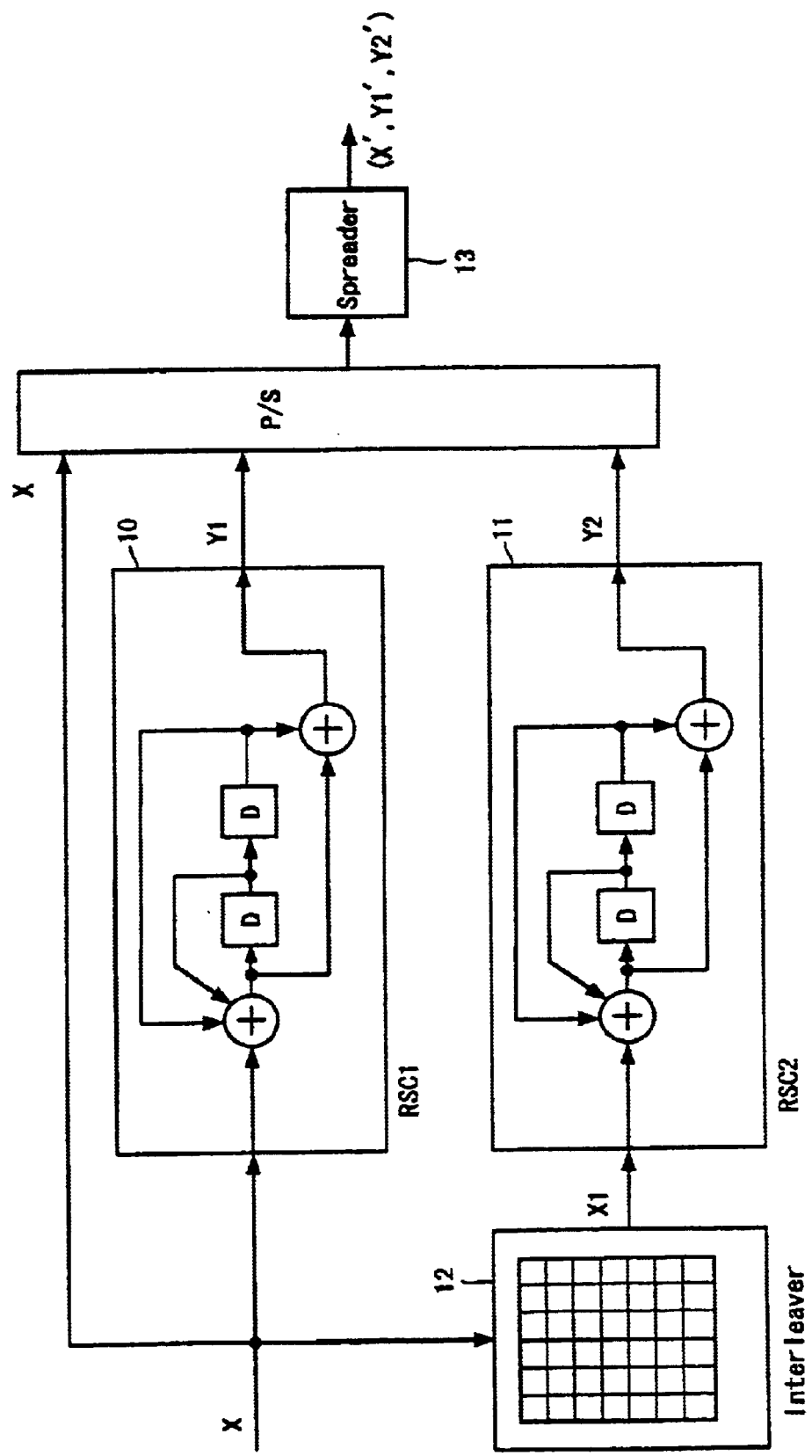
FIG. 1 is a block diagram showing a turbo encoder in accordance with the first embodiment of the present invention.
Figure 2:
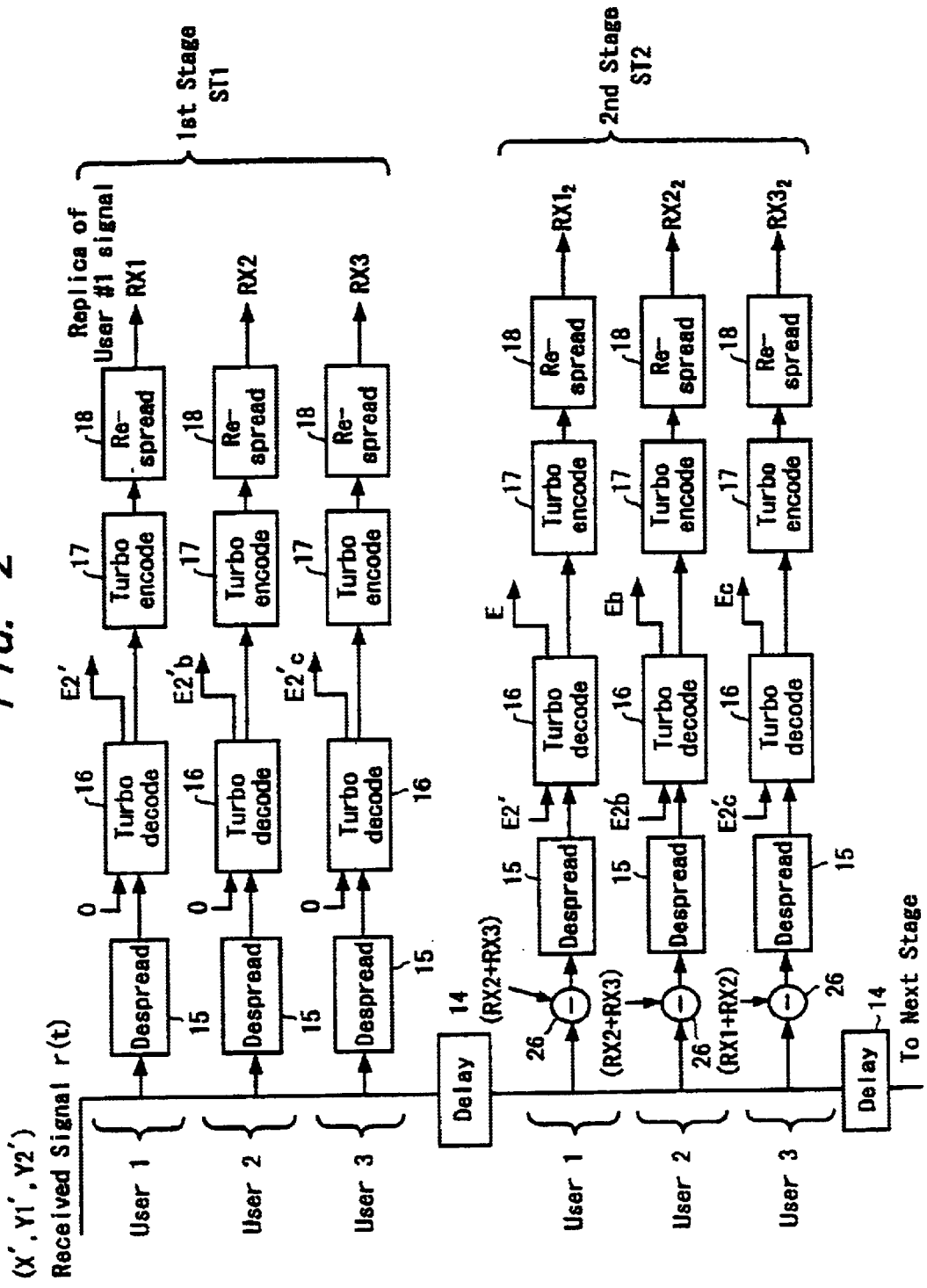
FIG. 2 is a block diagram showing the first and second stages of a turbo decoding process in accordance with the first embodiment of the present invention.
Figure 3:
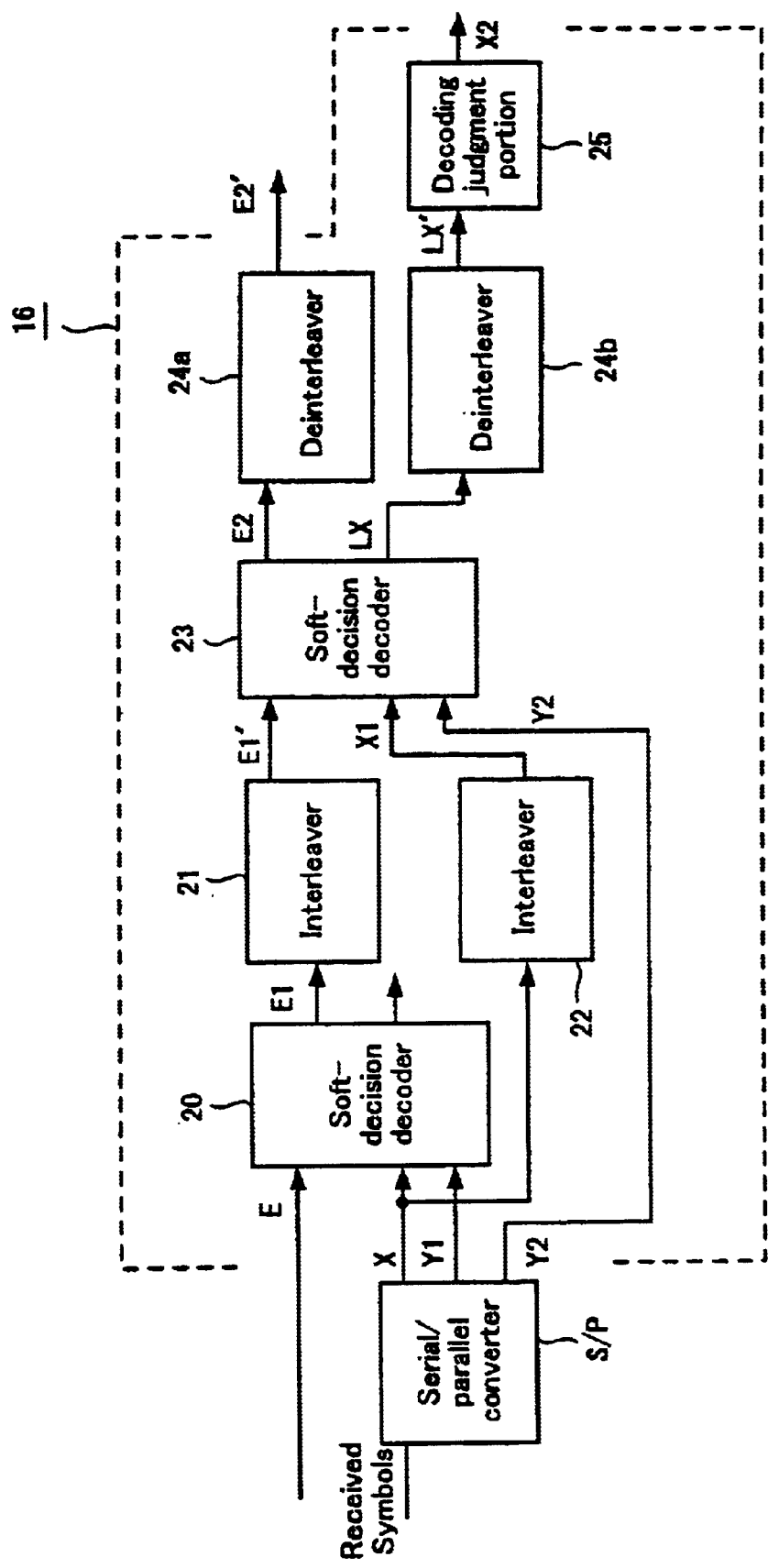
FIG. 3 is a block diagram showing a turbo decoder in accordance with the first embodiment of the present invention.

Referring now to FIGS. 1 to 3 the first embodiment of the present invention will be described in detail.

FIG. 1 is a block diagram showing a parallel concatenated convolutional coder (PCCC: turbo encoder) wherein a systematic (recursive) convolutional (RSC) encoders 10 and 11 are arranged in parallel with an interleaver 12 interposed therebetween.

Interleaver 12 rearranges an input data sequence X so as to create a data sequence XI which is composed of the same elements but arranged in a different order.

The data sequence (parity data) obtained by recursively convoluting an input data sequence X through RSC encoder 10 is assumed as Y1 while the data sequence (parity data) obtained by recursively convoluting the data sequence XI, which was rearranged by interleaver 12, through encoder 11 is assumed as Y2.

In other words, the first parity code sequence Y1 and the second parity code sequence Y2 are generated from input data sequence X, so the encoder produces parallel outputs (X, Y1, Y2).

Upon transmission, the input data sequence X, first code sequence Y1 and second code sequence Y2 are passed through a parallel/serial converter P/S and the processed result is spectrum despread through a spreader 13 so that the signal is send out as a spread code sequence (X'. Y1', Y2').

FIG. 2 shows a basic structure of a turbo decoder of a received signal r(t) which is comprised of transmitted signals from a plurality of transmitting stations. Here, for description convenience, illustration is given showing a case where three users are making code division multiple access on the same frequency. In FIG. 2, one cycle of decoding is called one stage, and the first stage ST1 and the second stage ST2 among iterative decoding are shown. Here, since decoding of an identical scheme is implemented in parallel for every user, the turbo-code decoder for one user will be described hereinbelow.

As shown in FIG. 2, the initial stage of the turbo decoding process, or the first stage ST1, is comprised of a despreader 15, turbo-code decoder 16, turbo-code re-encoder 17 and re-spreader 18, all being arranged in series.

Despreader 15 despreads the input received signal sequence (X', Y1', Y2') using respective spreading codes. In this process, some interference component may remain in each signal depending on the strength of cross-correlation. The despread received signal sequences (X, Y1, Y2) are made to pass through serial/parallel converter S/P (see FIG. 3) and are supplied separately to turbo-code decoder 16.

In turbo-code decoder 16, a single cycle of decoding process is performed first. This operation of decoding is the same as the conventional decoding process of turbo codes and will be described with reference to the block diagram shown in FIG. 3.

Turbo-code encoder 16 is generally comprised of soft-decision decoders 20 and 23, interleavers 21 and 22, a deinterleaver 24 and a decoding judgment portion 25.

Soft-decision decoders 20 and 23 are soft-decision decoding portions producing soft-decision output based on soft-decision input. For example, they are decoders which implement MAP decoding, SOVA (Soft output Viterbi Algorithm) decoding or the like, and execute decoding using the likelihood information from the previous stage and output the decoded result with likelihood information and the likelihood information of the decoded result.

Interleavers 21 and 22 implement the same operation as that of interleaver 12 used on the encoder side and can be provided as a single interleaver portion by one of them being shared.

Deinterleaver 24 is a rearranging means for restoring the original data sequence from the data sequence which has been rearranged by the interleaver. This may also be shaped with the above interleavers 21 and 22. However, in the case where the interleavers 21 and 22 are used for this purpose, an unillustrated switch or the like is needed as the switching means for switching input data.

Decoding judgment portion 25 is a means for creating data after error correction and removes the likelihood from the decoded symbols with likelihood and determines whether the information is 0 or 1.

The thus configured parallel concatenated convolutional code (turbo code) decoder 16 receives the received signal sequences (X, Y1, Y2) and the likelihood information E determined by the previous decoding process of the signal. Among these, the received signal sequences (X, Y1) and likelihood information E are input en bloc to soft-decision decoder 20, where the first error correcting process of the soft-decision output is implemented. By this operation, the error correcting process corresponding to the systematic convolutional coding in systematic convolutional encoder 10(FIG. 1) is implemented, resultantly new likelihood information E1 for each signal is produced.

Since rearrangement of data is implemented by interleaver 12 prior to the systematic convolution by systematic convolutional encoder 11 as shown in FIG. 1, interleavers 22 and 21 corresponding to input data X and likelihood information E1 implement rearrangement of data to create new data sequences X1 and E1', respectively. Then, using this likelihood information, soft-decision decoder 23 performs soft-decision soft-output error correcting process of the received signal sequences (X1, Y2) in combination with the likelihood information E1'. By this operation, the error correcting process corresponding to the encoding in systematic convolutional encoder 11 is implemented, resultantly decoded result LX with likelihood information and the likelihood information E2 are produced.

Since the data sequences X1 and E1' input to soft-decision decoder 23 have been rearranged by interleavers 22 and 21, the data of likelihood information E2 should be rearranged by a deinterleaver 24a to produce likelihood information E2'. This likelihood information E2' is used once again as the likelihood information E (E2') for soft-decision soft-output error correcting process which will be implemented at the next stage by soft-decision decoder 20.

The decoded result LX' with likelihood after rearrangement output from deinterleaver 24b is supplied to decoding judgement portion 25 where its likelihood information is removed so as to produce error corrected data X2.

Here, as shown in FIG. 2, pieces of likelihood information corresponding to the second and third users which are extracted at the first stage and input to associated decoders 16 at the second stage are represented by E2'b and E2'c, respectively. Similarly, pieces of likelihood information extracted from associated decoders 16 at the second stage and input to associated decoders 16 at the unillustrated third stage are represented by E, Eb and Ec, receptively.

The data sequence X2 (FIG. 3) obtained as the decoded result of the above one cycle of decoding is input to encoder (turbo encoder) 17 for producing a replica signal of the transmitted signal as shown in FIG. 2 so that it is once again encoded into turbo codes, which is further spread again at a re-spreader 18 by spreading codes to generate a replica signal RX1 of the transmitted signal. The replica signals of users 2 and 3 are designated by RX2 and RX3, respectively.

In order to create replicas of the signals from other users sent out from other base stations, three series of blocks from the despreader 15 to re-spreader 18 are provided in parallel for individual users to configure the first stage ST1.

The second stage ST2 is implemented by an iterative process of the first stage ST1. That is, the received signal r(t) is passed through a delay circuit (Delay) 14 so that the process of the second stage is implemented with a delay of a predetermined time lag relative to the first stage. In the second stage ST2, a subtracter 26 for subtracting replica signals RX of other users (the second and third users) from the input data sequence X' of the received signal is provided prior to despreader 15, in addition to the configuration of the first stage. In the first stage ST1, replica signals RX of other users to be subtracted are null, so that they are not depicted.

In the second stage ST2, first in subtracter 26, replica signals (RX2+RX3) for other users (the second and third users) obtained from the previous stage ST1 are subtracted from the received signal r(t) (cancellation of interference components) so as to produce new received sequences (input data sequence X2', the first code sequence Y1', the second code sequence Y2'). Here, cancellation of the interference components can be implemented correctly by subtracting the replicas (RX2+RX3) of the interference components, which have been generated from the replica signals by taking into account the influences of the gains of the communication paths, phase rotations, and other factors, as the signal of the bandwidth of the signal spread from the received signal.

The above received sequences (X2', Y1', Y2') are despread by despreader 15 and supplied to turbo decoder 16.

At this point, the first user likelihood information E2' which was generated at the first stage ST1 is used as extrinsic information.

The process after turbo decoder 16 and downwards includes the same processes 17 and 18 as the first stage ST1, where a replica signal $RX1_2$ is produced.

Thus, by repeating the process similar to the way that data decoding and generation of replica signals are implemented in the second stage ST2, in a usual, iterative manner of decoding for turbo codes, it is possible to cancel the interference components as well as to decode turbo codes as error correcting codes, with a simple configuration. That is, the turbo-code decoder of the present embodiment is featured by provision of the function of generating replica signals RX from interfering stations and removing them from the received signal, so that the complexity of decoding will not increase compared to the conventional turbo decoders (through the repeated number should be increased in order to obtain improved characteristics). Further, when the turbo decoding process is substituted by a simple hard-decision process, this results in a similar configuration to the conventional subtraction type multi-stage interference canceller, thus enabling a simple configuration to perform both cancellation of interference components and decoding of turbo codes as error correcting codes, simultaneously.

(The Second Embodiment)

Next, the second embodiment of the present invention will be described in detail with reference to FIG. 4. Here, the same components as in the above embodiment are allotted with the same reference numerals and the description will be omitted.

In the above first embodiment, the turbo decoding process at decoder 16 at each stage ST is performed once for every stage and then the operation goes to the subsequent stage ST. In this case, when replica signal RX is produced, the precision of generation of the replica signal may become lowered if the decoded data includes many errors, possibly leading to an increase in errors. To avoid this, in the present embodiment, errors of the decoded data are reduced by performing a predetermined number of feedback loops in the turbo decoding process at each stage so as to enhance the accuracy in producing replica signals.

Figure 4:
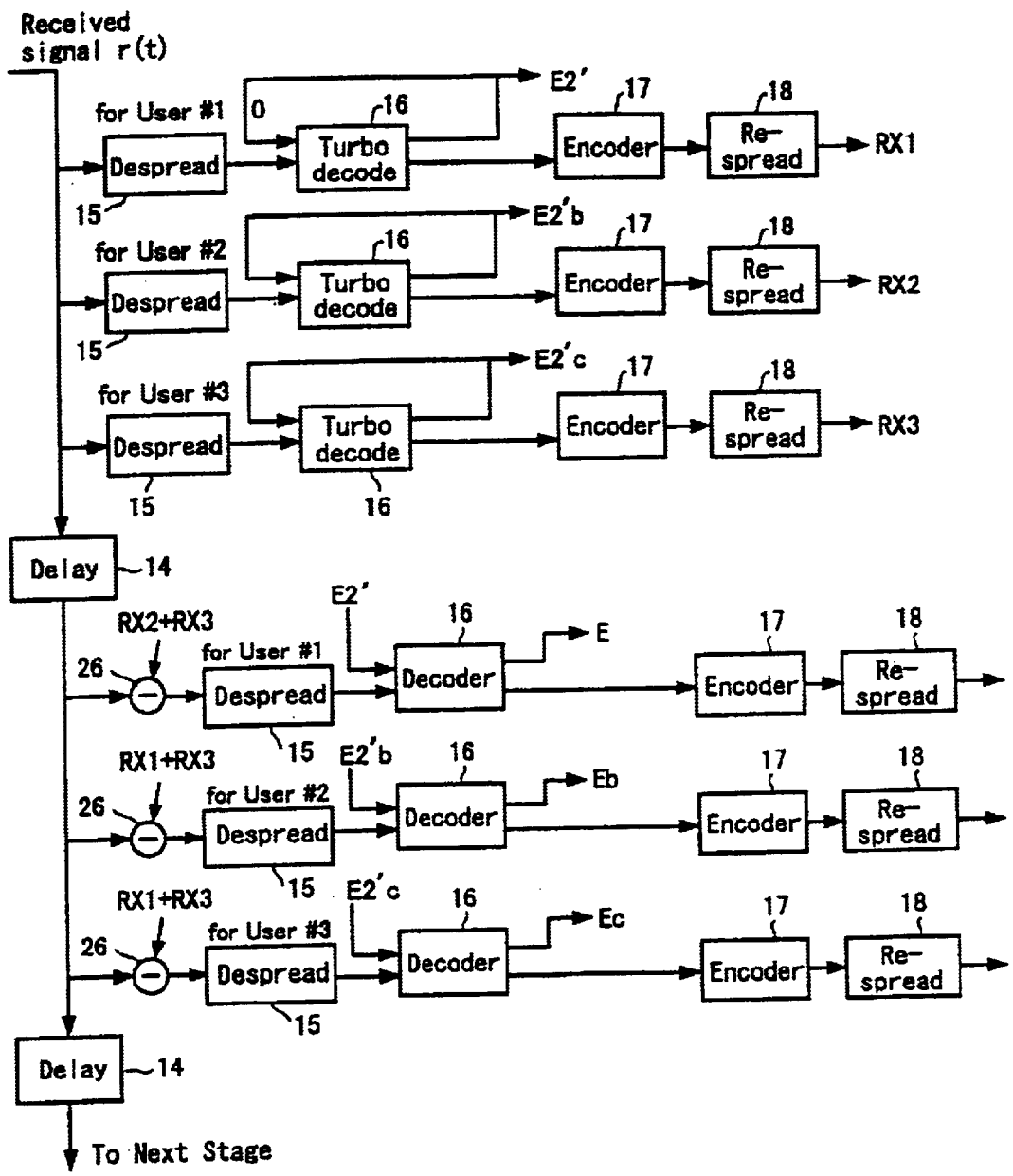
FIG. 4 is a block diagram showing the first and second stages of a turbo decoding process in accordance with the second embodiment of the present invention.

FIG. 4 is a block diagram showing a process scheme in the present invention. The difference from the arrangement of the first embodiment shown in FIG. 2 is in that a plurality of loops are repeated for decoding turbo codes at each decoder 16 before replica signal RX is produced at the first stage ST1. More specifically, iterative turbo decoding process is performed by using the likelihood information E2' from deinterleaver 24 (FIG. 3) as the input likelihood information E to the first stage ST1. After reduction of decoded data errors by the above process, replica signal RX is produced, and this is followed by the interference cancellation process at the second stage ST2.

Of course, the iterative number of turbo-code decoding process at each stage ST can be set arbitrarily. For example, it is possible to vary the number of loops such that there are six loops at the first stage ST1 and one loop only at the second stage ST2 and thereafter.

Thus, the above process enables effective implementation of interference cancellation by reducing errors of decoded data X2 (FIG. 3) hence enhancing the accuracy of the replica signals RXn when replica signals RXn are produced.

(The Third Embodiment)

Next, the third embodiment of the present invention will be described in detail with reference to FIGS. 5 and 6. Here, the same configurations as in the above embodiments are allotted with the same reference numerals and the description will be omitted.

Figure 5:
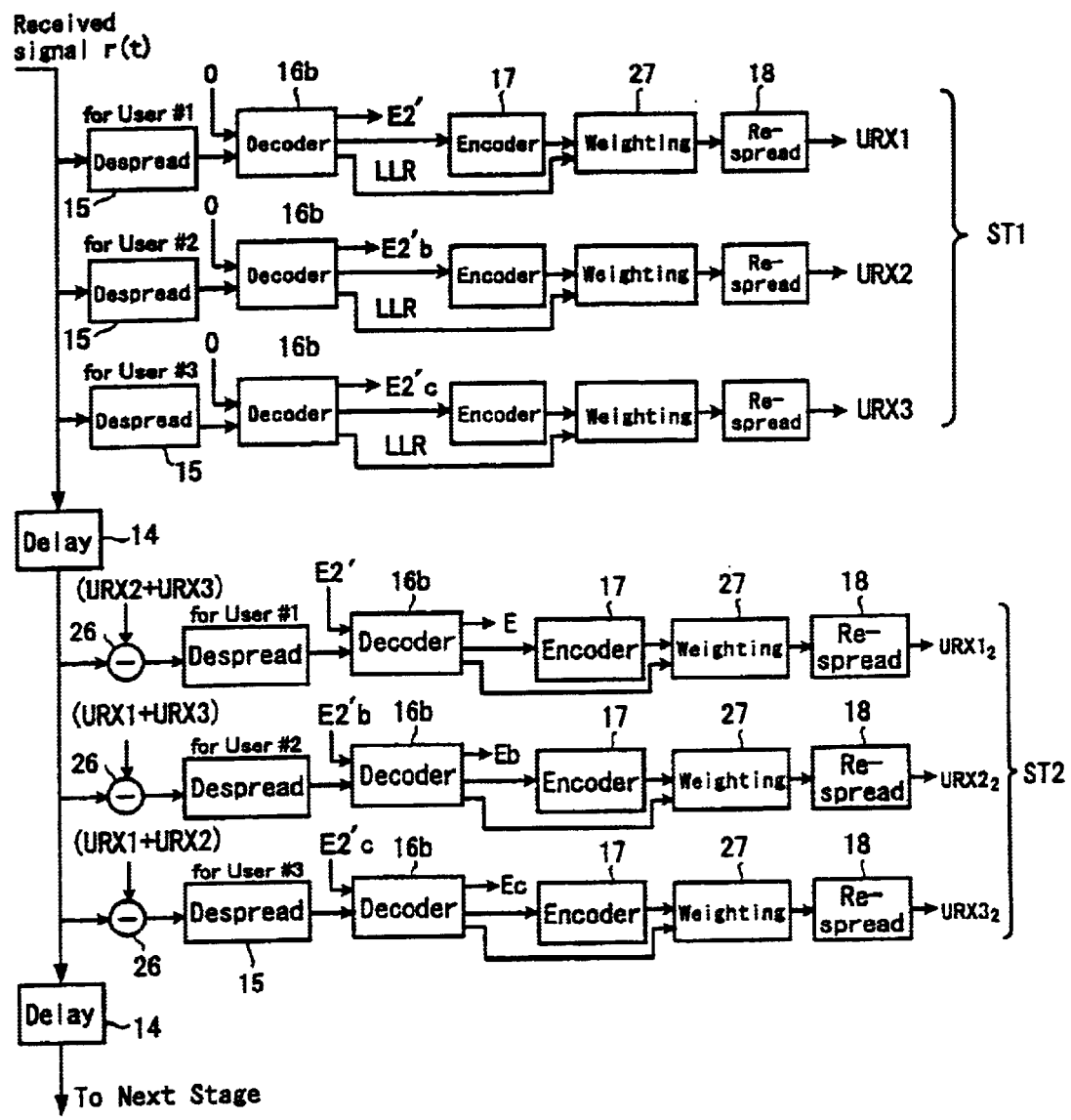
FIG. 5 is a block diagram showing the first and second stages of a turbo decoding process in accordance with the third embodiment of the present invention.

FIG. 5 is a block diagram showing the system configuration of the present embodiment. The difference from the configuration of the first embodiment resides in that decoders 16b output likelihood values LY1 and LY2 of parity data Y1 and Y2 (FIG. 6) and aweighting portion 27 is provided downstream of each turbo encoder 17 (FIG. 5).

Weighting portion 27 is a means which is disposed downstream of turbo encoder 17 and estimates the accuracy of the replica signal based on the likelihood information LLR (FIG. 6) obtained from the decoding process of turbo codes at decoder 16b and performs a weighting process on the replica signal. The error corrected data X2 having been weighted by weighting portion 27 is spread by re-spreader 18 so as to produce a weighted replica signal URX.

Similarly to the above embodiment, the weighted replica signals URX1 to URX3, produced at the first stage ST1 for different users are supplied appropriately to subtracting portions 26 of each user at the next stage, or second stage ST2, so as to implement subtraction of the sum of the weighted replica signals of the other users.

Figure 6:
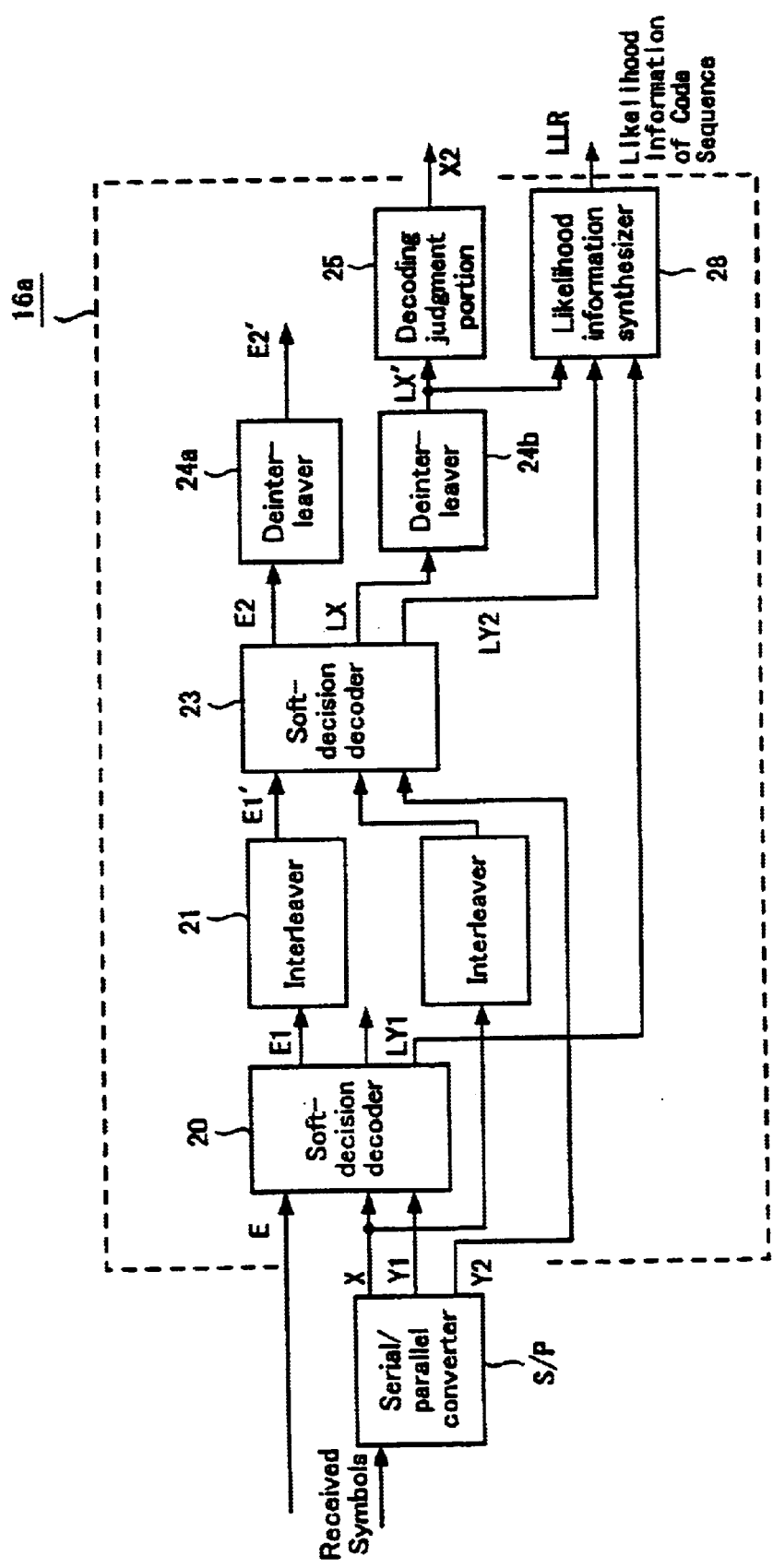
FIG. 6 is a block diagram showing a turbo decoder in accordance with the third embodiment of the present invention.

In order to be able to output the likelihood values of parity data Y1 and Y2, the decoder 16b has a likelihood information synthesizer 28 as shown in FIG. 6, in addition to the configuration of the above-described decoder 16. Likelihood information synthesizer 28 receives as its input the parity symbol LY1 with likelihood information determined by soft-decision decoder 20, the parity symbol LY2 with likelihood information determined by soft-decision decoder 23 and decoded symbol LX' with likelihood information output from deinterleaver 24b and outputs as likelihood information of a code sequence the likelihood information of the decoded symbol and parity symbols en bloc to weighting portion 27 (FIG. 5).

The likelihood values of parity symbols Y1 and Y2 (FIG. 6) can be obtained by the above equation (6) similarly to the likelihood value of the aforementioned information symbol (the information symbol $u_k$ is assumed to be the parity symbol).

The weighted replica signal is given by the following equation (9):

$$I_k = \tanh(L(x)) \cdot \delta(\text{sign}(x), x'),$$

where x is substituted by uk. $\delta(a,b)$ is a function which is equal to 1 when a=b only and is equal to 0 otherwise. x' indicates a symbol obtained by re-encoding. Sign(x) is a function which is equal to 1 when x is positive and is equal to −1 when x is negative. That is, the weight is set at the tanh of the likelihood information LLR when the sign of the re-encoded symbol coincides with that of the symbol obtained from the likelihood information LLR, and set at 0 otherwise.

Figure 7:
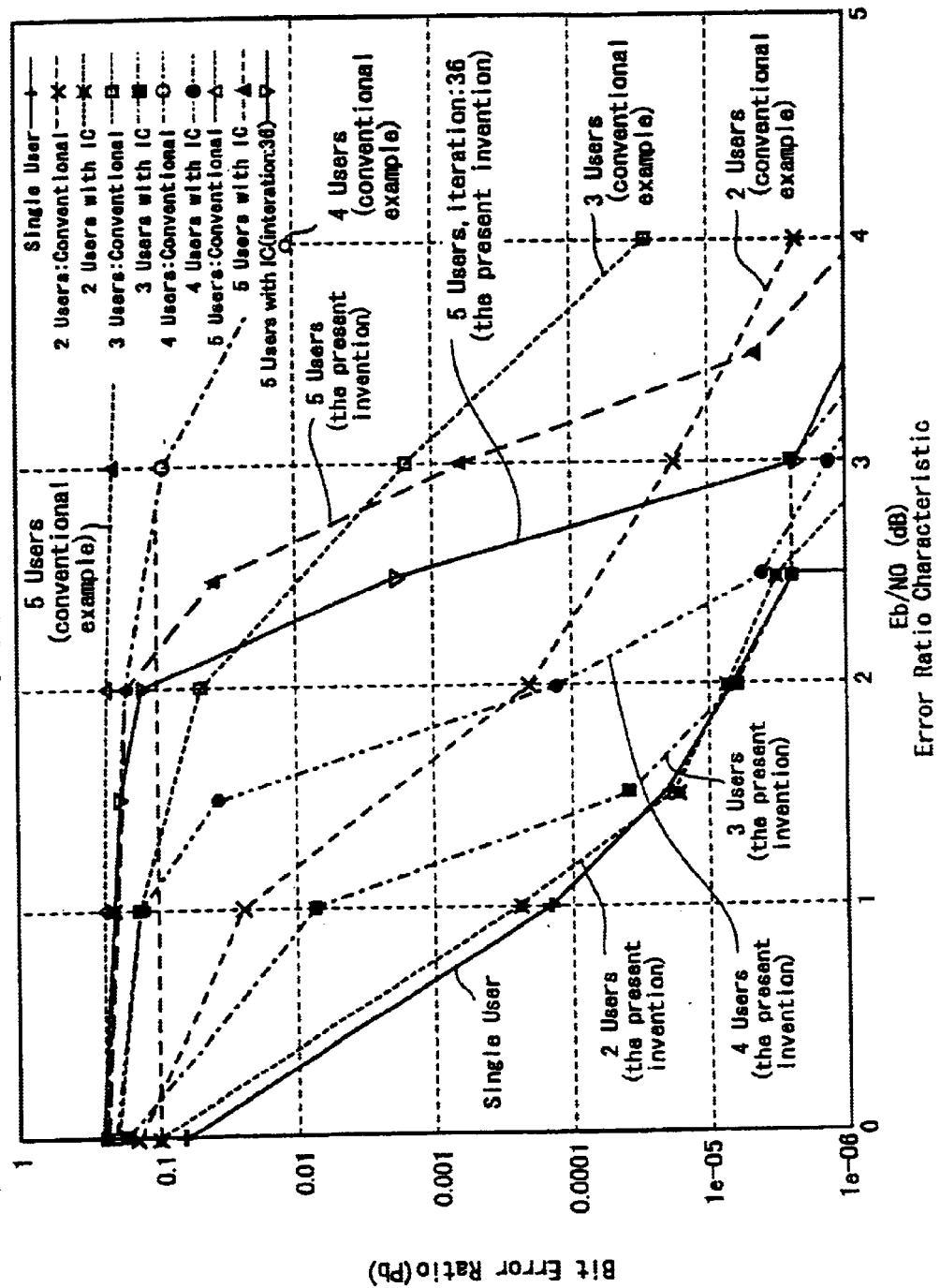
FIG. 7 is an error ratio characteristics chart in accordance with the third embodiment of the present invention.

FIG. 7 shows error ratio characteristics of the present embodiment. Turbo-codes have a constraint length of 3 and a block length of 1000. The number of iterative decoding is assumed to be 18. The modulations for both the information modulation and spread modulation are implemented by the BPSK (Binary Phase Shift Keying). The spreading ratio is 4 and as to the spreading codes, the maximal-length sequence having a period of $(2^{18}-1)$ is truncated based on the frame length. It is assumed that the communication path is static and the wanted station and interfering stations present the same received signal level.

FIG. 7 comparatively shows the characteristics of the cases where the number of users varies from one to five under the above conditions. The single user case is free from interference and is assumed to present the ideal characteristics. In contrast, as the number of users increases, degradation of the characteristic occurs due to interference. However, the decoding operation with the interference canceling (IC) function of the present embodiment turned out to markedly improve the characteristics.

As described heretofore, each code block is subjected in parallel or in series with others to the process comprising the steps of producing replicas of the transmitted signals by weighting the aforementioned error corrected signal X2 (FIG. 6) in accordance with the ratio of the interference with the wanted component of the received signal, using the likelihood information and subtracting the replicas from the received signal (to remove interference components). This cycle is repeated over a plurality of stages to thereby complete the decoding process, whereby it is possible to obtain high-accuracy decoded result.

(The Fourth Embodiment)

Figure 8:
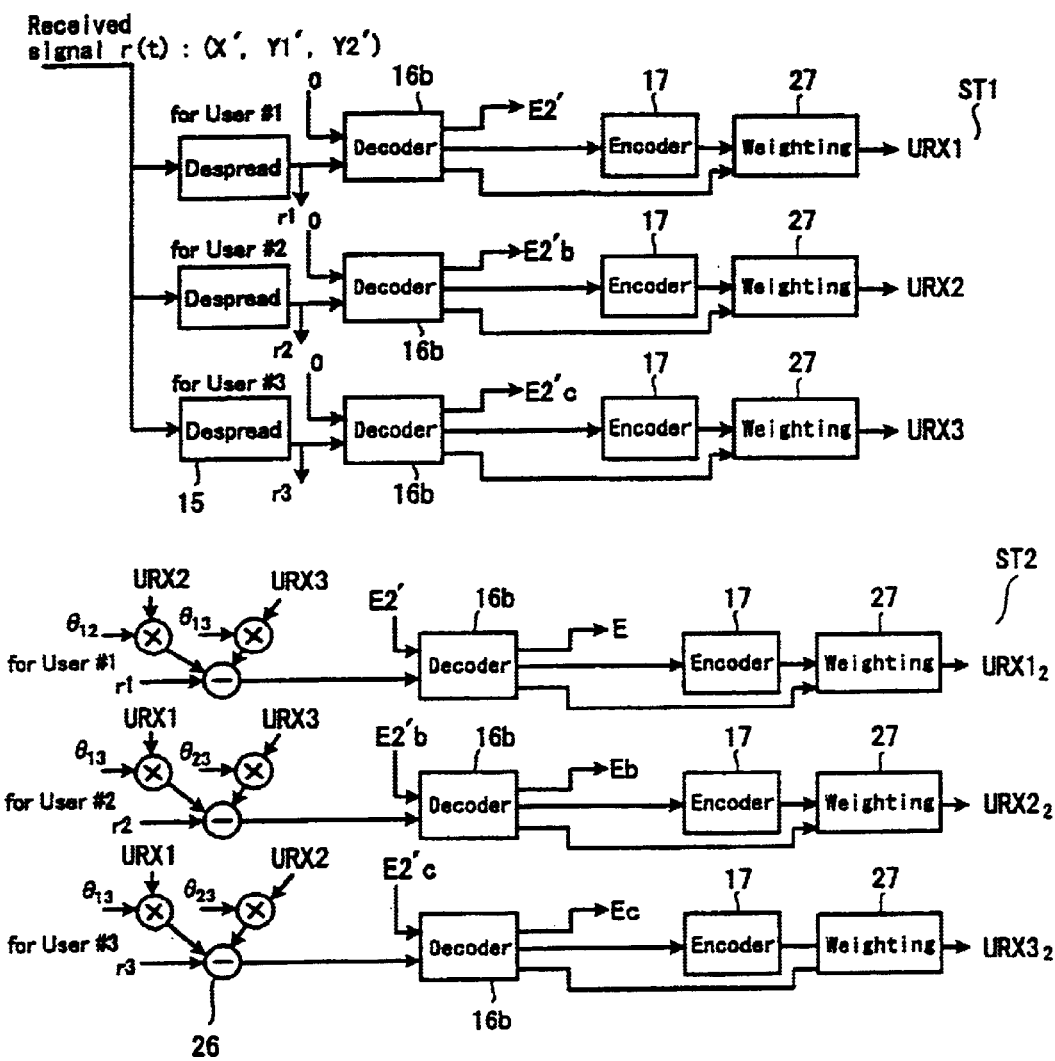
FIG. 8 is a block diagram showing the first and second stages of a turbo decoding process in accordance with the fourth embodiment of the present invention.

Next, the fourth embodiment of the present invention will be described in detail with reference to the block diagram showing a system configuration of the present embodiment shown in FIG. 8. Here, the same components as in the above embodiments are allotted with the same reference numerals and the description will be omitted.

In each stage in the first through third embodiments, a spread received signal r(t) is received while the spread replica signals RX generated for individual user in the previous stage are subtracted. In this embodiment, received signal sequences r1 (X', Y1', Y2') are reverse spread in the first stage ST1 and they are supplied as the input signals to the second stage ST2 and downwards.

Therefore, no despreader 15 as above is provided for the second stage and downwards. Since the input signals to the second stage and downwards are not spread signals, the replica signals of the transmitted signals produced at each stage do not need to be spread so no re-spreader 18 (FIG. 2) is provided.

Accordingly, at subtracter 26 at the second stage ST2 or downwards, the sum of the non-spread replica signals of the others is subtracted from the despread received signal sequences (X, Y1, Y2). In this case, each replica signal is multiplied (weighted) by a cross-correlational value $(\theta_{i,j})$ between associated spread codes to implement the subtraction. Specifically, for the reception of the first user, the second user replica signal URX2 multiplied by cross-correlational value $(\theta_{1,2})$ and the third user replica signal URX3 multiplied by cross-correlational value $(\theta_{1,3})$ are subtracted from the despread received signal sequence X.

Thus, interference cancellation through subtracter 26 is implemented by weighting taking into account the influences of the gains, phase rotations of the communication paths and the cross-correlation between the spread codes and further weighting based on the obtained likelihood information and subtracting the result in units of the symbols after despreading.

Also in this case, a highly-accurate decoded result equivalent to the above embodiments could be obtained.

(The Fifth Embodiment)

Figure 9:
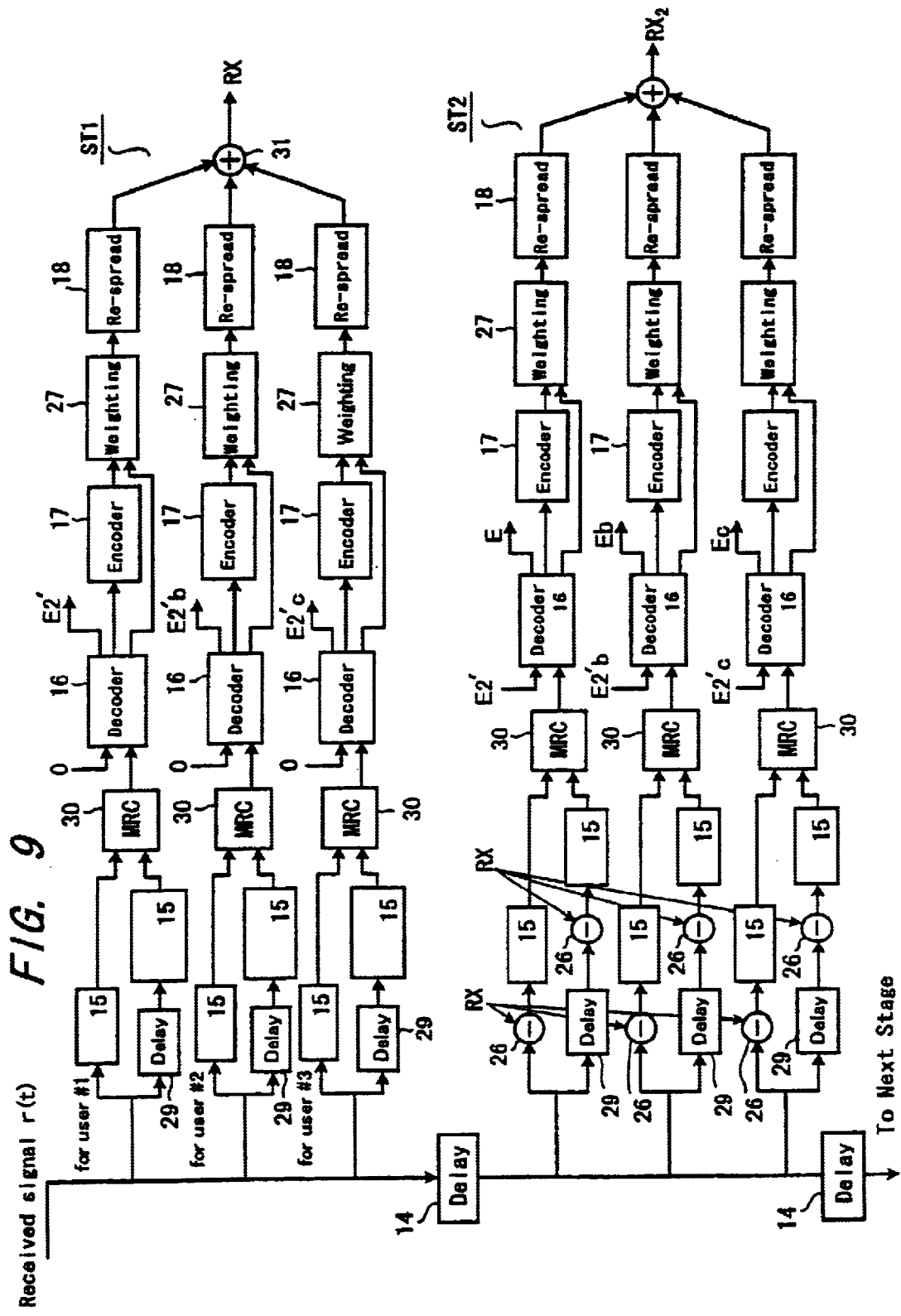
FIG. 9 is a block diagram showing the first and second stages of a turbo decoding process in accordance with the fifth embodiment of the present invention.
Figure 12:
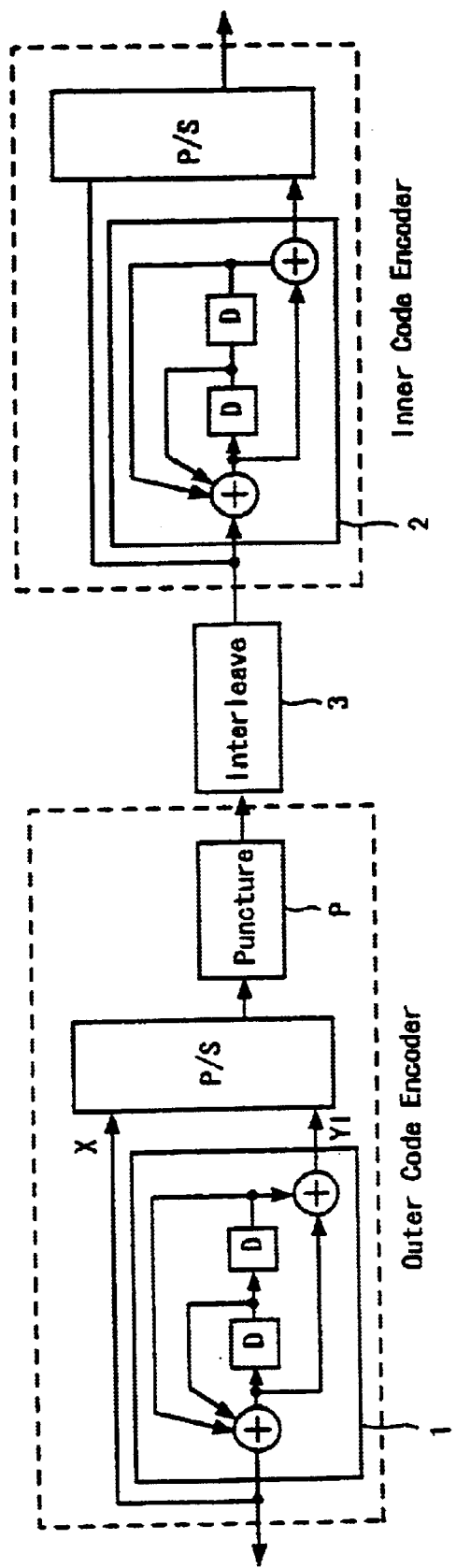
FIG. 12 is a block diagram showing a conventional SCCC encoder.
Figure 13:
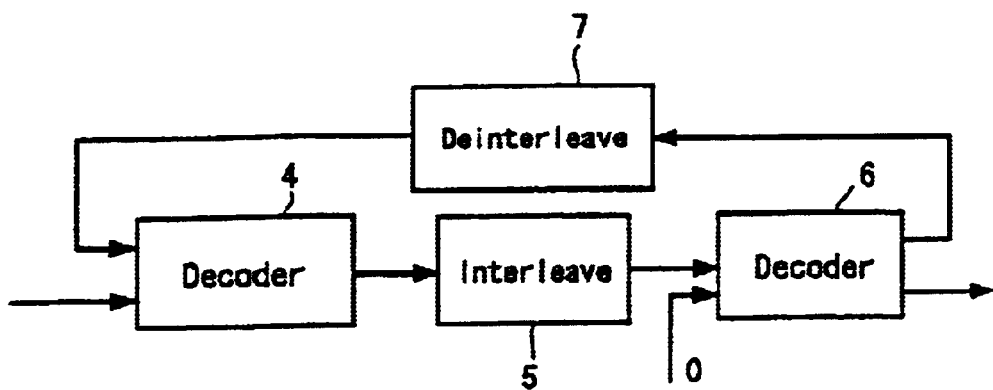
FIG. 13 is a block diagram showing a conventional SCCC decoder.

Referring next to FIG. 9, the fifth embodiment of the present invention will be described in detail. FIG. 9 is a block diagram showing a system configuration of this embodiment, wherein a circuit configuration when transmitting stations implement multi-code transmission of information sequences using a plurality of spread codes orthogonal to each other. Here, the same components as in the above embodiment are allotted with the same reference numerals so that the description will be omitted.

The difference of this embodiment from the configuration of the third embodiment is that in order to deal with multi-code transmission using a plurality of spread codes orthogonal to each other, a pair of despreaders 15 are provided in parallel while a delay circuit 29 is disposed prior to one of the spreaders 15 and an MRC circuit 30 for implementing Rake synthesis is provided on the downstream side of the pair of despreaders 15.

Further, an adder 31 for summing replica signals (restored symbols) at the same stage is provided and a subtracter 26 for subtracting the sum of the replica signals RX in adder 31 is provided prior to each of despreaders 15 at the second stage and downwards.

A plurality of electric waves or transmitted signals undergo different delays depending on the communication paths and are received together by the receiver. In multi-code transmission using orthogonal spread codes, no interference occurs between signals free from any delay, but signals having delays therebetween will interfere with each other.

At the first stage ST1, the received signal undergoing other station's interference arising in the code division multiple access (CDMA) system is reverse spread through each despreader 15 based on the associated spreading code and the result is subjected to the Rake synthesis. Thereafter the signal is decoded (once) by turbo coding. The decoded information sequence is again turbo-coded by turbo encoder 17, and the resultant signal is weighted by weighting portion 27 using likelihood information LLR (FIG. 6) in the same way as in the third embodiment. This is re-spread by re-spreader 18. The thus obtained re-spread signals are synthesized by adder 31 to produce a replica signal RX of the transmitted signal.

At the second stage ST2, the replica signal RX of the transmitted signal is subtracted from the received signal in subtracter 26 at the timing of the delayed wave so as to extract the leading wave component, which is reverse spread by despreader 15. In the same manner, the leading wave is removed so as to extract the delayed wave, which is reverse spread by despreader 15. The thus despread received signals are subjected to maximum ratio composition at MRC circuit 30, whereby signal components corresponding to respective spreading codes can be extracted. From here and thereafter, the decoding process after decoder 16 is repeatedly performed using likelihood information E2' of the prior stage, in the same manner as in the third embodiment.

Though the above description of the present embodiment was made of removal of interference components and decoding of error correcting codes when using turbo codes, it is also possible to obtain the same effects as in the case where a serial concatenated convolutional coding (SCCC) is used. With SCCC codes, systematic convolutional encoder 10 as an outer code encoder and systematic convolutional encoder 11 as an inner code encoder are provided serially with an interleaver 12 interposed therebetween. In the decoding process, soft-decision soft-output is repeatedly implemented in the same manner as decoding of turbo codes at the turbo decoder. Accordingly, application of SCCC decoding to the above turbo-code encoders 16, 16b makes it possible for a simple configuration to perform cancellation of interference components and SCCC decoding as error correcting codes, simultaneously, in the same manner as the above embodiments.

As has been described heretofore, according to the present invention, by adding the operation of removing interfering components to the decoding process of turbo codes, it is possible to bring great improvement in the characteristics such that decoding of error correcting codes and interference cancellation can be performed simultaneously while increase in the amount of processing is suppressed.

INDUSTRIAL APPLICABILITY

The concatenated convolutional code decoder of the present invention is useful as a decoder enabling high-speed, high-quality communication in the field of digital communications and can be suitably applied to error correcting means for the internet and communications for digital cellular phones.

What is claimed is:

1. A concatenated convolutional code decoder in a receiving device which receives transmitted signals of encoded signals, which each have been produced by convolutionally encoding an information signal using a concatenated convolutional encoder having a first convolutional encoder and second convolutional encoder for implementing conventional encoding, connected in parallel or in series with an interleaver interposed therebetween for rearranging input data based on a predetermined rule, the concatenated convolutional code decoder comprising:

a plurality of decoding and encoding portions, each having (i) a soft-decision decoding portion for implementing a soft-decision decoding process which decodes a received signal using a likelihood information for decoding produced by a previous soft-decision decoding process and outputs a decoded signal and a likelihood information for decoding of the decoded signal, (ii) a concatenated convolutional encoding portion for subjecting the decoded signal at the soft-decision decoding portion to the same convolutional encoding process as that of the concatenated convolutional encoder to produce a replica of a transmitted encoded signal, and (iii) a transmitted signal replicating portion for producing a replica of a transmitted signal from the replica of the encoded signal produced at the concatenated convolutional encoding portion; and an interference canceler for removing from the received signal an interference signal which is determined by the transmitted signal replicating portion, based on a replica of a transmitted signal from a transmitting station from which no reception is wanted.

2. The concatenated convolutional code decoder according to claim 1, wherein the processing sequence from the interference canceler to the decoding and encoding portion can be repeated by a predetermined number of times.

3. The concatenated convolutional code decoder according to claim 1, wherein the received signal is a spread signal including transmitted signals from a plurality of transmitting stations, a despreading portion for despreading the received signal using a spreading code of each of the transmitting stations are provided, the soft-decision decoding portion receives as an input signal a signal that has been despread by the despreading portion, and the transmitted signal replicating portion has a spreading portion for spreading the replica of the transmitted signal.

4. The concatenated convolutional code decoder according to claim 1, wherein the received signal is a despread signal based on a spreading code, the interference canceler is adapted to weight the interference signal of the replica, being among the replicas of the transmitted signals produced at the transmitted signal replicating portions, of the transmitted signal which is not wanted to be received, in accordance with a cross-correlation between the spread codes and implements an interference cancellation in units of the symbols after despreading.

5. The concatenated convolutional code decoder according to claim 1, wherein a received signal output from the interference canceler is subjected to the soft-decision decoding process at the soft-decision decoding portion to extract an information signal.

6. The concatenated convolutional code decoder according to claim 1, wherein the soft-decision decoding portion determines the information signal after the soft-decision decoding process has been repeated by a predetermined number of times.

7. The concatenated convolutional code decoder according to claim 5, wherein the soft-decision decoding portion comprises:
   a first soft-decision decoder for implementing soft-decision decoding corresponding to a first convolutional encoder based on the received signal and outputting a first likelihood information;
   an interleaver portion for rearranging the received signal and the first likelihood information in correspondence with the interleaver and outputting a rearranged received signal and a rearranged first likelihood information:
   a second soft-decision decoder for implementing soft-decision decoding corresponding to a second convolutional encoder based on the received signal, the rearranged first likelihood information and the rearranged received signal and outputting a second decoding information and a second likelihood information;
   a deinterleaver portion for rearranging the second decoding information and the second likelihood information in correspondence with the interleaver and outputting a rearranged second decoding information and the likelihood information for decoding; and
   a decoding judgment portion for judging the rearranged second decoding information and outputting the decoded information signal.

8. A concatenated convolutional code decoder in a receiving device which receives transmitted signals of encoded signals with parity signals, which each have been produced by convolutionally encoding an information signal using a concatenated convolutional encoder having a first convolutional encoder and second convolutional encoder for implementing conventional encoding, connected in parallel or in series with an interleaver interposed therebetween for rearranging input data based on a predetermined rule, the concatenated convolutional code decoder comprising:
   a plurality of decoding and encoding portions, each having
   (i) a soft-decision decoding portion for implementing a soft-decision decoding process which decodes a received signal using a likelihood information for decoding produced by a previous soft-decision decoding process and outputs a decoded signal, a likelihood information for decoding of the decoded signal and a code sequence likelihood information of the decoded signal and parity signals,
   (ii) a concatenated convolutional encoding portion for subjecting the information signal determined at the soft-decision decoding portion to the same convolutional encoding process as that of the concatenated convolutional encoder to produce a replica of a transmitted encoded signal,
   (iii) a transmitted signal replicating portion for producing a replica of a transmitted signal from the replica of the transmitted encoded signal produced at the concated convolutional encoding portion, and
   (iv) a weighting portion for weighting the replica of the encoded signal or the replica of the transmitted signal using the code sequence likelihood information; and an interference canceler for removing from the received signal an interference signal which is determined by the weighting portion, based on a replica of a transmitted signal from a transmitting station from which no reception is wanted.

9. The concatenated convolutional code decoder according to claim 8, wherein the received signal is a spread signal including transmitted signals from a plurality of transmitting stations, a despreading portion for despreading the received signal using a spreading code of each of the transmitting stations are provided, the soft-decision decoding portion receives as an input signal a signal that has been despread by the despreading portion, and the transmitted signal replicating portion has a spreading portion for spreading the replica of the transmitted signal weighted by the weighting portion.

10. The concatenated convolutional code decoder according to claim 8, wherein a received signal output from the interference canceler is subjected to the soft-decision decoding process at the soft-decision decoding portion to extract an information signal.

11. The concatenated convolutional code decoder according to claim 10, wherein the soft-decision decoding portion comprises:
   a first soft-decision decoder for implementing soft-decision decoding corresponding to a first convolutional encoder based on the received signal and outputting a first likelihood information and a first parity likelihood information as to a first parity signal;
   an interleaver portion for rearranging the received signal and the first likelihood information in correspondence with the interleaver and outputting the rearranged received signal and a rearranged first likelihood information;
   a second soft-decision decoder for implementing soft-decision decoding corresponding to a second convolutional encoder based on the received signal, the rearranged first likelihood information and the rearranged received signal and outputting a second decoding information, a second likelihood information and a second parity likelihood information as to a second parity signal;
   a deinterleaver portion for rearranging the second decoding information and the second likelihood information in correspondence with the interleaver and outputting a rearranged second decoding information and the likelihood information for decoding;
   a decoding judgment portion for judging the rearranged second decoding information and outputting the decoded information signal; and
   a likelihood information synthesizer for outputting a code sequence likelihood information based on the rearranged second decoding information, the first parity likelihood information and the second parity likelihood information.

12. The concatenated convolutional code decoder according to claim 10, wherein the soft-decision decoding portion determines the information signal after the soft-decision decoding process has been repeated by a predetermined number of times.

13. The concatenated convolutional code decoder according to claim 8, wherein the processing sequence from the interference canceler to the decoding and encoding portion can be repeated by a predetermined number of times.

14. The concatenated convolutional code decoder according to claim 8, wherein the received signal is a despread signal based on a spreading code, the interference canceler is adapted to weight the interference signal of the replica, being among the replicas of the transmitted signals produced at the transmitted signal replicating portions, of the transmitted signal which is not wanted to be received, in accordance with a cross-correlation between the spread codes and implements an interference cancellation in units of the symbols after despreading.

* * * * *